United States Patent [19]
Tanino et al.

[11] Patent Number: 5,905,654
[45] Date of Patent: May 18, 1999

[54] METHOD AND DEVICE FOR DESIGNING LAYOUT OF MILLIWAVE OR MICROWAVE INTEGRATED CIRCUIT

[75] Inventors: Noriyuki Tanino; Yoshinobu Sasaki, both of Itami, Japan

[73] Assignee: Mitsubishi Denki Kabushiki Kaisha, Tokyo, Japan

[21] Appl. No.: 08/134,798

[22] Filed: Oct. 12, 1993

[30] Foreign Application Priority Data

Nov. 26, 1992 [JP] Japan .................................. 4-341712

[51] Int. Cl.$^6$ ...................................................... G06F 17/50
[52] U.S. Cl. ............... 364/491; 364/468.09; 364/468.28; 364/578
[58] Field of Search ..................................... 364/488, 489, 364/490, 491, 578, 468.09, 468.28

[56] References Cited

U.S. PATENT DOCUMENTS

| | | | |
|---|---|---|---|
| 4,805,113 | 2/1989 | Ishii et al. | 364/490 |
| 5,031,111 | 7/1991 | Chao et al. | 364/490 |
| 5,051,373 | 9/1991 | Yamada et al. | 364/490 |
| 5,097,422 | 3/1992 | Corbin et al. | 364/490 |
| 5,191,542 | 3/1993 | Murofushi | 364/489 |
| 5,309,371 | 5/1994 | Shikata et al. | 364/489 |
| 5,396,433 | 3/1995 | Kosugi | 364/468 |
| 5,452,224 | 9/1995 | Smith, Jr. et al. | 364/488 |
| 5,457,399 | 10/1995 | Krumm | 324/758 |

OTHER PUBLICATIONS

Giannini et al. "CAD Facilities for GaAs MMIC Mask Design and Generation". ALTA FREQUENZA, Jan. 1989, Milano, Italy. pp. 39–44.

*Primary Examiner*—Kevin J. Teska
*Assistant Examiner*—Russell W. Frejd
*Attorney, Agent, or Firm*—Leydig, Voit & Mayer

[57] ABSTRACT

A method of designing the layout of milliwave and microwave integrated circuits using a computer aided design system includes displaying each of a plurality of kinds of lumped circuit elements and distributed constant transmission lines for an integrated circuit on a cathode ray tube display as respective closed drawing objects, each object having an area and dimension representing electrical data; connecting the drawing objects displayed on the cathode ray tube display by overlapping edges of them with each other to produce a virtual integrated circuit having the circuit construction of the integrated circuit; and performing logical operations on the overlapping drawing objects of the virtual integrated circuit according to a design rule defined in accordance with a production process for producing the integrated circuit to produce at least one mask pattern for manufacturing the integrated circuit.

11 Claims, 19 Drawing Sheets

Fig. 4

| | drawing object | example of connection |
|---|---|---|
| resistor | element part / connecting part (box with X's) | resistor / microstrip line |
| FET | element part / connecting part | FET / microstrip line / via-hole |
| MIM capacitor | element part / connecting part | MIM capacitor / microstrip line |
| via-hole | (square with circle) | via-hole / microstrip line |
| bonding pad | (rectangle) | microstrip line / bonding pad |
| air bridge | element part / connecting part | air bridge / crossing microstrip line / microstrip line |

Fig. 9 FET part ion implantation step

Fig. 10  FET part ohmic electrode production step

FET part gate metal production step

Fig. 13  First contact hole production step

MIM capacitor upper electrode and wiring metal production step

Fig. 15  Second contact hole production step for contacting the airbridge metal and the wiring metal Fig. 18    ( Prior Art )

METHOD AND DEVICE FOR DESIGNING LAYOUT OF MILLIWAVE OR MICROWAVE INTEGRATED CIRCUIT

FIELD OF THE INVENTION

The present invention relates to a method and a device for designing the layout of a milliwave semiconductor integrated circuit (hereinafter referred to as milliwave IC) or a microwave semiconductor integrated circuit (hereinafter referred to as microwave IC) and, more particularly, to reducing the burden on a circuit designer due to easy design work as well as accelerating processing speed in optimizing layouts.

BACKGROUND OF THE INVENTION

Conventionally, layout design of a milliwave or microwave IC using a computer aided design (CAD) system has been carried out as follows: storing circuit element data required for making a desired IC in a data base, determining a margin for alignment on the basis of mask alignment precision and a processing precision in transcribing step of an IC production process as a design rule employing a data format for producing a specific mask pattern (for example, CALMA GDSII format), and producing each mask pattern corresponding to each transcribing step manually on the basis of this design rule. Here, the mask pattern is a pattern corresponding to each transcribing step, which is drawn on a mask or a reticle employed in the IC production process.

However, the mask pattern data is necessary for each of the transcribing steps of the IC production process. As described above, since the circuit designer must produce a mask pattern in each transcribing step considering the design rule in the process, skill is required for inputting and editing the data in producing the mask pattern, and further the mask pattern must be modified whenever the IC production process is changed. Such work requires much effort and a long time.

Then, recently, as a method for reducing data inputting work by manual operation, a method for designing a layout of a monolithic microwave IC (hereinafter referred to as MMIC) by CAD system using a software on the market (for example, Academy by Eesof, MDS of HP, Microwave Musician by Cadence, Serenade by Compact Software), which can automatically generate a mask pattern of each circuit element from a circuit diagram of an IC to be designed, has been examined. FIG. 18 is a flowchart illustrating this method of layout design.

In this method of layout design, as shown in this flowchart, first, a mask pattern of each circuit element of an MMIC to be designed is automatically generated on a cathode ray tube (CRT) display from a circuit diagram of the MMIC, and the automatically generated mask patterns of the respective circuit elements are connected with each other, obtaining a diagram of a mask pattern of the whole MMIC. Then, the mask patterns for connecting parts are input according to the connecting methods between the circuit elements to be connected, and the mask pattern of the whole MMIC is edited by, for example, leaving a space between the mask patterns of the respective circuit elements generated in the respective transcribing steps according to the design rule of the production process. Electrical parameters are extracted from the mask pattern of the whole MMIC after editing, and a circuit simulation is executed. When desired electrical characteristics are obtained, the operation is completed. When desired electrical characteristics are not obtained, by changing the size and the configuration of the mask patterns for the connecting parts and re-editing the mask pattern of the whole MMIC, the layout of the mask pattern of the whole MMIC is optimized.

Here, in the above-described flow, after producing the diagram of the mask pattern of the whole MMIC, the mask patterns for connecting parts are input according to the connecting methods between the respective circuit elements to be connected, because conductor layers having terminals used for connection are different for every circuit element, such as an FET, MIM capacitor, and airbridge of the MMIC, and the connecting methods are different according to the kinds of circuit elements to be connected. After inputting the mask patterns for connecting parts, the electrical parameters are extracted and a circuit simulation is executed, because it is necessary to adjust the electrical parameters of the whole MMIC considering the mask patterns for connecting parts, since the size and the configuration of the connecting parts between the circuit elements influence electrical characteristics such as reflection, loss and phase in the milliwave or microwave IC.

The conventional method for designing the layout of the MMIC includes the above-described steps. Therefore, the data of the automatically generated mask pattern for every circuit element includes a pattern portion based on the design rules of the production process, i.e., electrically meaningless excessive data. In order to extract the electrical parameters and execute a circuit simulation as described above, a memory with a large capacity over 10 MB is required. As a result, not only the design device itself (CAD system) is more expensive but also its processing speed is slower, lengthening the times for optimizing the layout. Especially, when a change in the production process is required, new mask patterns on the basis of the design rule defined by the changed production process must be produced and input, and after editing the mask pattern of the whole MMIC, electrical parameters must be extracted and a circuit simulation must be executed again, further unfavorably lengthening the times for optimizing the layout.

It is required to produce mask patterns of the respective circuit elements for as many as transcribing steps as necessary for forming the respective circuit elements in the IC production process. In addition, when the IC production process is changed as described above, new mask patterns must be formed for every changed transcribing step, resulting in high costs in developing and maintaining the CAD program.

In the conventional CAD system, the terminal of a circuit element is defined by a point, and the circuit elements are electrically connected by points. Therefore, for example, when a center point of a line width of a microstrip line (a mask pattern for a microstrip line) is determined as a connecting point, as shown in FIG. 19(a), two mask patterns for microstrip line 2d and 2e extending in the same direction and having different widths from each other cannot be connected smoothly. And, as shown in FIG. 19(b), in connecting two mask patterns for microstrip lines 2f and 2g, at right angles the mask patterns must overlap each other in the vicinity of the connecting point, or a open area without a conductor is unfavorably formed in the vicinity of the connecting point. When such a discontinuous portion where the mask patterns are not smoothly connected is present, microwaves are reflected by this portion or radiation loss is increased. As a result, the mask patterns must be modified on the CRT display, which is a troublesome operation.

The above-described problems occur in designing the layout of not only a microwave IC but also a milliwave IC.

SUMMARY OF THE INVENTION

It is an object of the present invention to provide a method and a device for designing the layout of a milliwave IC or a microwave IC in which data for optimizing the layout can be the minimum amount of data necessary for electrical design of the IC and processing speed is accelerated without requiring an expensive memory.

It is another object of the present invention to provide a method and a device for designing layout of a milliwave IC or a microwave IC in which the burden on the circuit designer is reduced due to the easy design work.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

According to a first aspect of the present invention, a method of layout designing a milliwave IC or a microwave IC using a computer aided design system includes displaying each of a plurality of kinds of lumped circuit elements and distributed constant transmission lines of an IC chip to be designed on a cathode ray tube (CRT) display with a closed drawing object on the two dimensional plane, the area and dimension representing electrical data, connecting the drawing objects on the CRT display with overlapping edges to produce a virtual IC on the CRT display, that has the same circuit construction as the IC to be designed, optimizing the layout of the virtual IC by changing at least one of the areas, dimensions, arrangements and configurations of the respective drawing objects of the virtual IC so that the entire area of the virtual IC is as small as possible and the electrical characteristics of the virtual IC are equal to the IC to be designed and performing a logical operation on the layout data of the virtual IC that are optimized to form a mask pattern for integrated circuit production. Since, the data for optimizing the layout of the IC to be designed comprises only the data required for electrical design of the IC to be designed, consequently a memory required for executing a circuit simulation for optimizing the electrical characteristics is reduced relative to the conventional method, and the processing time of the circuit simulation is reduced. Design of the layout and generation of the mask patterns are completely separated so that it is not necessary to obtain the layout data whenever the production process is changed, differently from the conventional method. Further, the layout design is performed without depending on an IC production process, and even if the IC production process, i.e., producing apparatus and production environments, is changed, a mask pattern for IC production is produced instantaneously in accordance with design rules of the changed IC production process.

According to a second aspect of the present invention, in the above-described method of layout designing a milliwave IC or a microwave IC, while displaying a drawing object representing a lumped circuit element on the CRT display, displaying on the side of the drawing object connection segments each comprising a drawing object closed on the two dimensional plane, which connection segments represent connection margins between circuit elements to be provided in the actual production process. Therefore, the elements to be kept apart are not brought too close to each other, whereby editing work is performed with high precision.

According to a third aspect of the present invention, in the above-described method of layout designing a milliwave IC or a microwave IC, the electro-magnetic coupling between the circuit elements of the virtual IC is calculated on the basis of electro-magnetic field analysis theory and a circuit simulation is executed considering the electro-magnetic coupling between the circuit elements. Therefore, the layout of the virtual IC is optimized by considering variations in the electrical characteristics after the circuit elements are connected, resulting in more precise layout design.

BRIEF DESCRIPTION OF THE DRAWINGS

FIG. 4 is a table showing drawing objects representing circuit elements of a microwave IC and connecting examples of the drawing objects which are shown on a CRT display of the device for layout design of FIG. 2;

DETAILED DESCRIPTION OF THE PREFERRED EMBODIMENT

Figure 2:
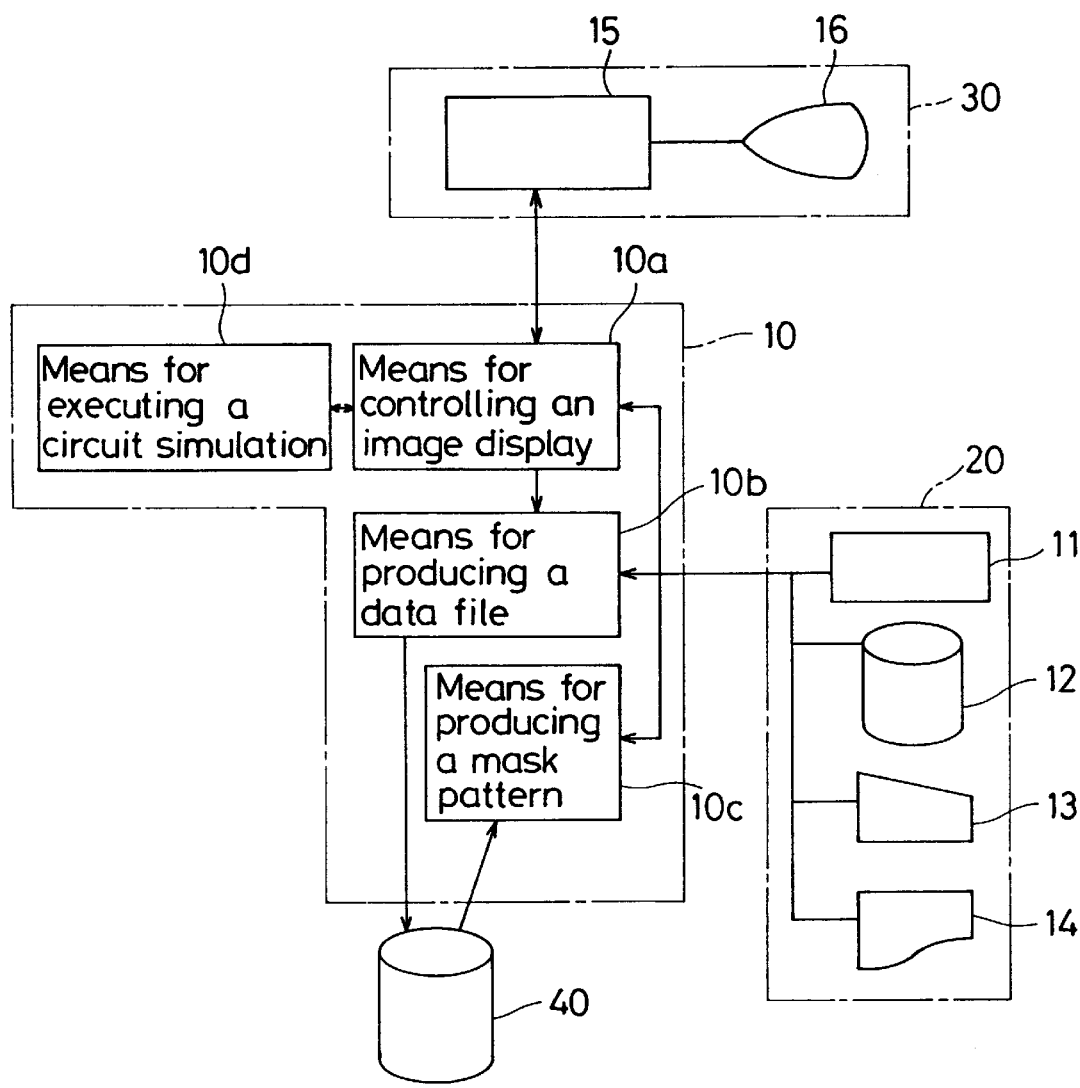
FIG. 2 is a block diagram showing a device for layout design in accordance with the present invention.

FIG. 2 is a block diagram showing hardware of a CAD system in accordance with the present invention. This computer aided layout design system comprises a central processing unit (CPU) 10, a data input/output system 20 for storing the data required for layout designing an integrated circuit (IC) and inputting/outputting data, an image display unit 30 for converting the data from the CPU 10 into image information and displaying it on a CRT display, and a data file storage device 40 for storing a data file produced in the CPU 10.

Here, the data input/output system 20 comprises an input device 13 comprising a keyboard, a mouse and the like for inputting the data, orders and design signals required when a circuit designer designs the layout of the IC, a disk device 12 storing the drawing data for displaying the respective circuit elements of the microwave IC, i.e., lumped circuit elements, such as FETs and MIM capacitors, and distributed constant transmission lines, such as microstrip lines, with closed drawing objects, for every such element, on the CRT display 16, a printer 14 for outputting the data stored in the disk device 12 or the image displayed on the CRT display 16 of the image display unit 30 at need, and a main storage 11 for storing control programs for the input device 13, the disk device 12, the printer 14 and the like.

The central processing unit 10 comprises means for controlling image display 10a for receiving the design signals from the circuit designer, decoding the signals and changing the size, the configuration and the arrangement of the drawing objects displayed on the CRT display 16 according to the design signals, means for producing a layout data file 10b of a virtual IC produced on the CRT display 16 by the image display controlling means 10a, means for executing a circuit simulation 10d of the virtual IC produced on the CRT display 16 by the image display controlling means 10a, and means for producing a mask pattern 10c for IC production by logical operation between drawing objects of the layout data of the virtual IC.

The image display unit 30 comprises an image data conversion device 15 for converting the data from the data input/output system 20 and the CPU 10 into image data, and the CRT display 16 for displaying images.

A layout data file produced in the layout data file producing means 10b is stored in the data file storage device 40, and data for logical operation, which is produced on the basis of the design rule in the actual production process for specifying the logical operation in the mask pattern producing means 10c, is stored in the disk device 12.

Figure 3:
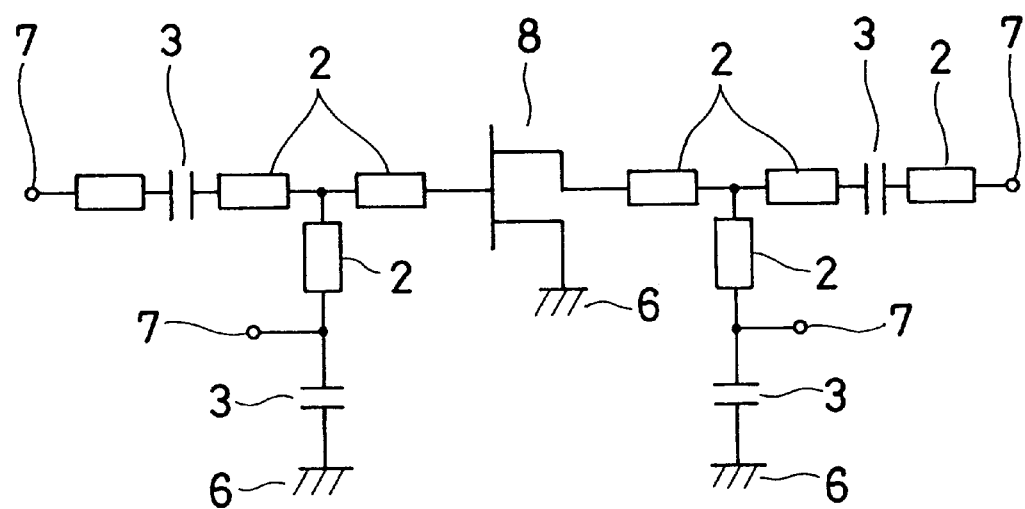
FIG. 3 is an equivalent circuit diagram illustrating a microwave IC designed by the device for layout design in accordance with the present invention.

On the other hand, FIG. 3 is a circuit diagram illustrating a microwave IC of which the layout is designed by this CAD system. In the figure, reference numeral 2 designates a microstrip line, numeral 3 designates an MIM capacitor, numeral 6 designates a via-hole, numeral 7 designates a bonding pad, and numeral 8 designates an FET.

Figure 1:
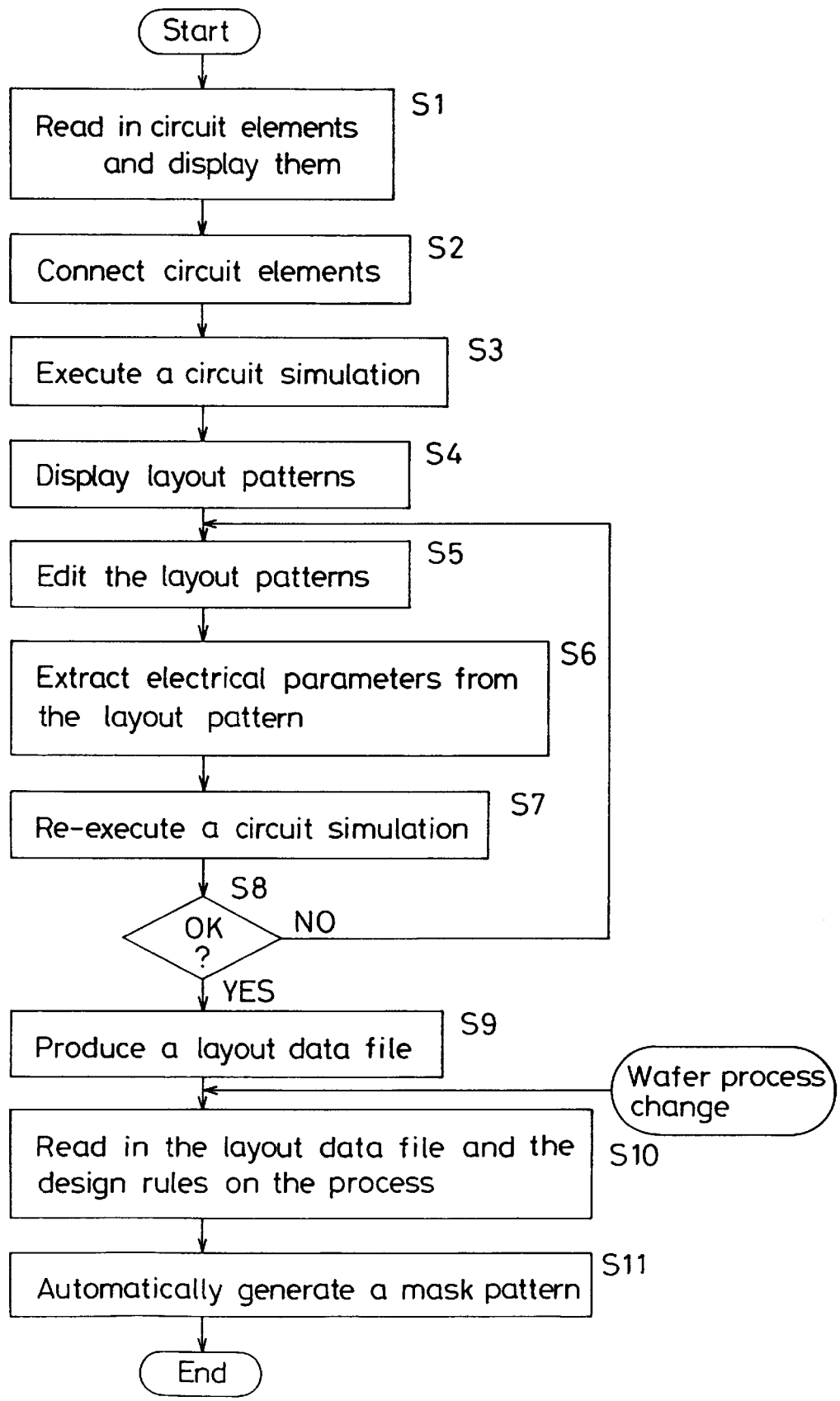
FIG. 1 is a flowchart showing a designing process in a method for layout design in accordance with the present invention.

A process of layout designing the microwave IC of FIG. 3 is described with reference to the flowchart of FIG. 1.

First, while looking at the circuit diagram of the microwave IC of FIG. 3, when a designer inputs signals for specifying the respective circuit elements of the microwave IC of FIG. 3 and the coordinate data for displaying the circuit elements in a predetermined location on the CRT display 16 from the input device 13, the drawing data representing the circuit elements respectively corresponding to the circuit elements of the microwave IC is read from the drawing data specifying a plurality of kinds of lumped circuit elements and distributed constant transmission lines, which are stored in the disk device 12, and the drawing data are displayed as drawing objects on the CRT display 16 of the image display unit 30 (step S1).

FIG. 4 is a table of drawing objects representing the drawing data of the circuit elements stored in the disk device 12, which are displayed on the CRT display 16. As shown in this figure, each lumped circuit element such as a resistor, FET, MIM capacitor, via-hole, bonding pad, and airbridge is displayed on the CRT display 16 as a closed drawing object comprising a rectangle or a combination of a rectangle and a circle. Here, the configurations and dimensions of the respective drawing objects represent electrical data of the respective circuit elements. The drawing objects are represented by enlarging the actual dimensions of the circuit elements with the same ratio, so that wave propagation distance and isolation between the circuit elements can be visually monitored. For instance, an explanation will be given taking an MIM capacitor as an example. Since the capacitance of the MIM capacitor is assigned in the circuit diagram of FIG. 3, the area of the capacitor having this assigned capacitance is determined, and the capacitor is represented by a rectangle corresponding to an area producing the assigned capacitance. At this stage, however, since the aspect ratio of the rectangle is not determined, the capacitor is represented by a square. In a distributed constant line such as microstrip line, since line impedance and an electrical length are determined to when designing the circuits, the line width is determined from the line impedance and a physical length is determined from the electrical length, representing the microstrip line with a closed drawing object on the CRT plane. Here, the respective drawing objects are color coded on the CRT display. Further, as shown in FIG. 4, at the same time, a rectangular connecting is represented on the side part of the circuit elements, which shows a connecting margin between the different circuit elements in the actual production process. This connecting part is represented with a rectangle smaller than a drawing object specifying the circuit element. In the figure, a rectangle with X and a rectangle with O are connected with different conductor layers of the circuit element.

Figure 5:
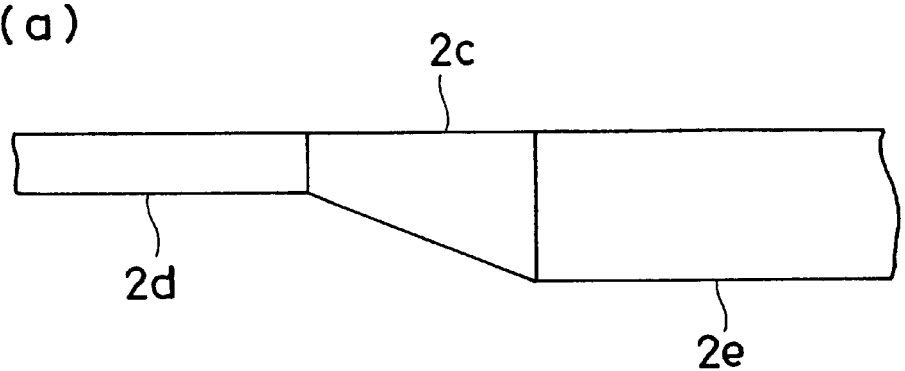
FIGS. 5(a) and 5(b) are diagrams respectively illustrating a connecting example of two drawing objects for microstrip line having different widths, and a connecting example of two drawing objects for microstrip line extending perpendicular to each other, which are shown on the CRT display of the device for layout design of FIG. 2.
Figure 5:
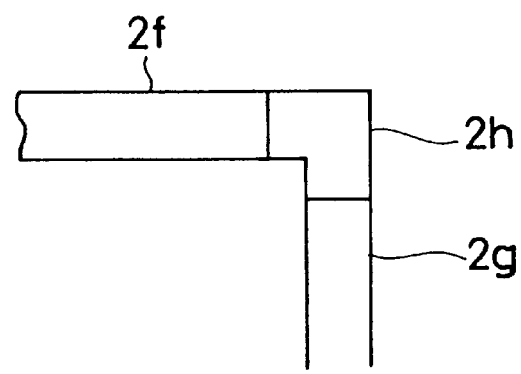

Secondly, when the designer inputs the design signals (connecting orders) from the input device 13 on the basis of the circuit diagram of the microwave IC of FIG. 3, the image display controlling means 10a decodes these design signals, moves the drawing objects displayed on the CRT display 16 according to the design signals, as shown in the connecting examples of FIG. 4, overlaps the edges of the respective drawing objects to be connected, and produces a virtual IC comprising the collection of the closed drawing objects closed on the plane (step S2). Here, when it is difficult to connect the circuit elements, since the configurations and the dimensions of the drawing objects representing lumped circuit elements such as FETs and MIM capacitors are not changed because they are determined on the basis of the electrical data of the elements, the elements are connected by bending the drawing objects representing the distributed constant lines such as microstrip lines. When the lengths of the edges of the drawing objects to be connected are different, for example, as shown in FIG. 5(a), connection of drawing objects representing two microstrip lines which extend in the same direction and have different line widths, is performed by displaying a trapezoidal drawing object representing a microstrip line 2c between two microstrip lines 2d and 2e having different line widths and by connecting these two drawing objects through this trapezoidal drawing object. And, as shown in FIG. 5(b), connection of drawing objects representing two microstrip lines perpendicular to each other is performed by displaying an L-shaped drawing object representing a microstrip line 2h between the drawing objects representing two microstrip lines 2f and 2g perpendicular to each other and by connecting these two drawing objects through this L-shaped drawing object.

Thirdly, when the designer inputs the order signals for executing a circuit simulation from the input device 13, the circuit simulation executing means 10d executes a circuit simulation of the virtual IC (layout pattern) (step S3).

Next, when the designer inputs the design signals for changing the dimensions and the configuration of the drawing objects corresponding to the circuit elements displayed on the CRT display 16 from the input device 13, according to the simulation results displayed on the CRT display 16, so that electrical parameters of the respective circuit elements, for example, a line length of a microstrip line, a capacitance of an MIM capacitor and the like, have a desired value, the image display controlling means 10a decodes these design signals, changes the dimension of each drawing object corresponding to each circuit element according to the design signals, and re-displays the changed virtual IC on the CRT display 16 (step S4).

Then, when the designer, looking at the CRT display 16, inputs design signals for changing the arrangement of the drawing objects corresponding to the lumped circuit elements, such as FET and capacitors, and the manner of bending the drawing objects corresponding to the distributed constant lines, such as microstrip lines, from the input device 13, so that the area of the chip is minimized, and the arrangement of the input and output pads matches the specification, without basically changing the connections of the virtual IC obtained at the step S4, the image display controlling means 10a decodes the design signals, changes the arrangement and the configurations of the drawing objects according to the design signals, and optimizes the layout of the virtual IC (step S5).

Figure 6:
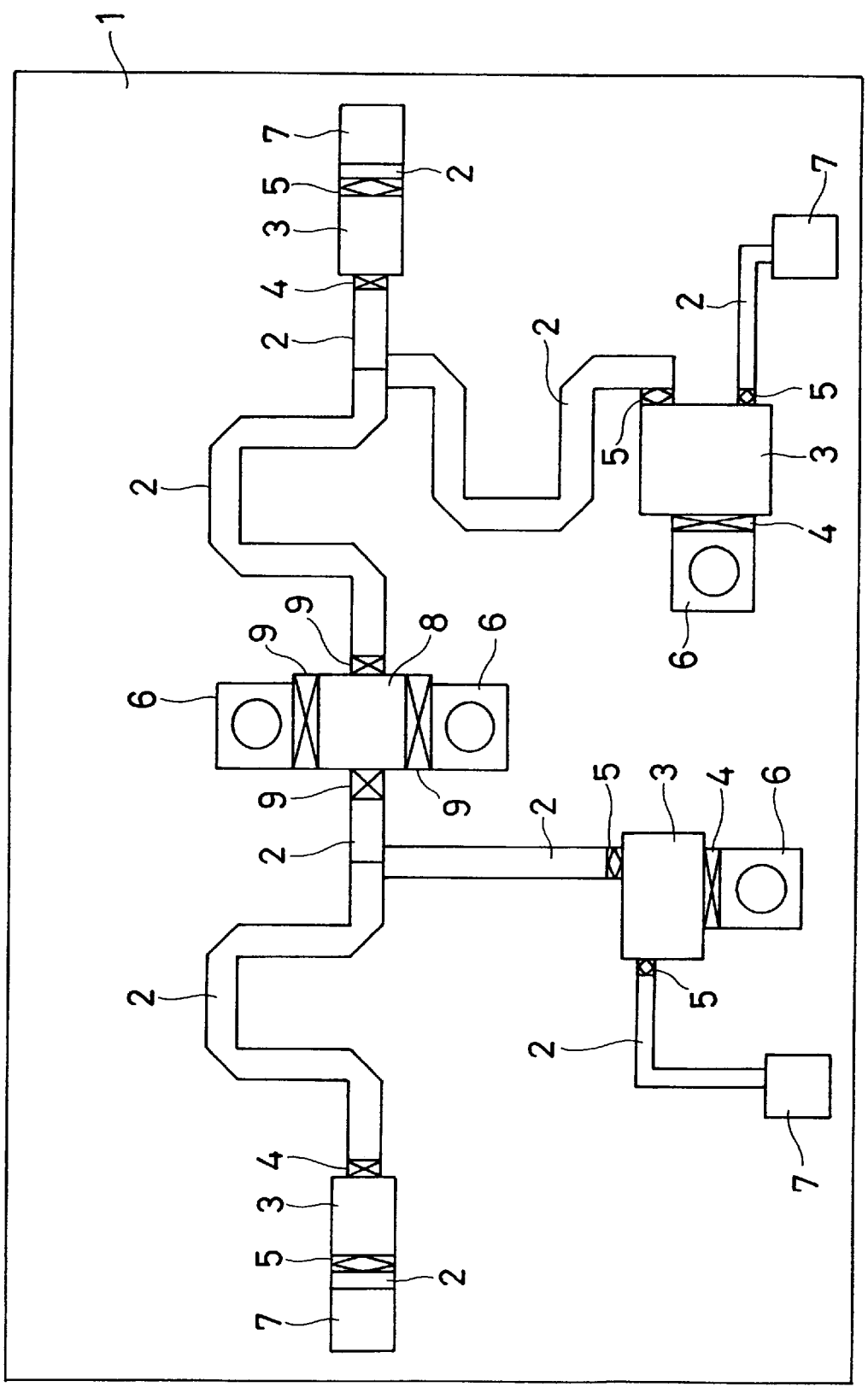
FIG. 6 is a diagram illustrating a layout pattern of a virtual IC comprising collections of drawing objects representing the circuit elements of the microwave IC shown on the CRT display of the device for layout design of FIG. 2.

Next, when the designer inputs the order signals for executing a circuit simulation from the input device 13, the circuit simulation executing means 10d divides the drawing object of each circuit element of the virtual IC into smaller patches, extracts the electrical parameters by calculating electro-magnetic coupling between the patches on the basis of electro-magnetic field analysis theory, and executes a circuit simulation using the extracted parameters (steps S6 and S7). Then, if the simulation result is a desired value (step S8), the designer inputs the orders for producing a layout data file from the input device 13. The layout data file producing means 10b receiving the orders, produces a data file from the layout data of the virtual IC, which layout is optimized, and stores the produced data file in the data file storage device 40. When the simulation result is not a desired value, the above-described steps S5 to S7 are repeated, and a layout data file is produced when the simulation result is a desired value (step S9). FIG. 6 shows a virtual IC in which the layout displayed on the CRT display 16 is optimized. In the figure, the same reference numerals as those of FIG. 3 designate the drawing objects corresponding to the circuit elements explained in FIG. 3. Reference numeral 1 designates an IC chip, numeral 4 designates a drawing object representing a connecting part of an MIM capacitor lower electrode, numeral 5 designates a drawing object representing a connecting part of an MIM capacitor upper electrode, numeral 8 designates a drawing object representing an FET and numeral 9 designates a drawing object representing a connecting part of an FET.

Figure 7:
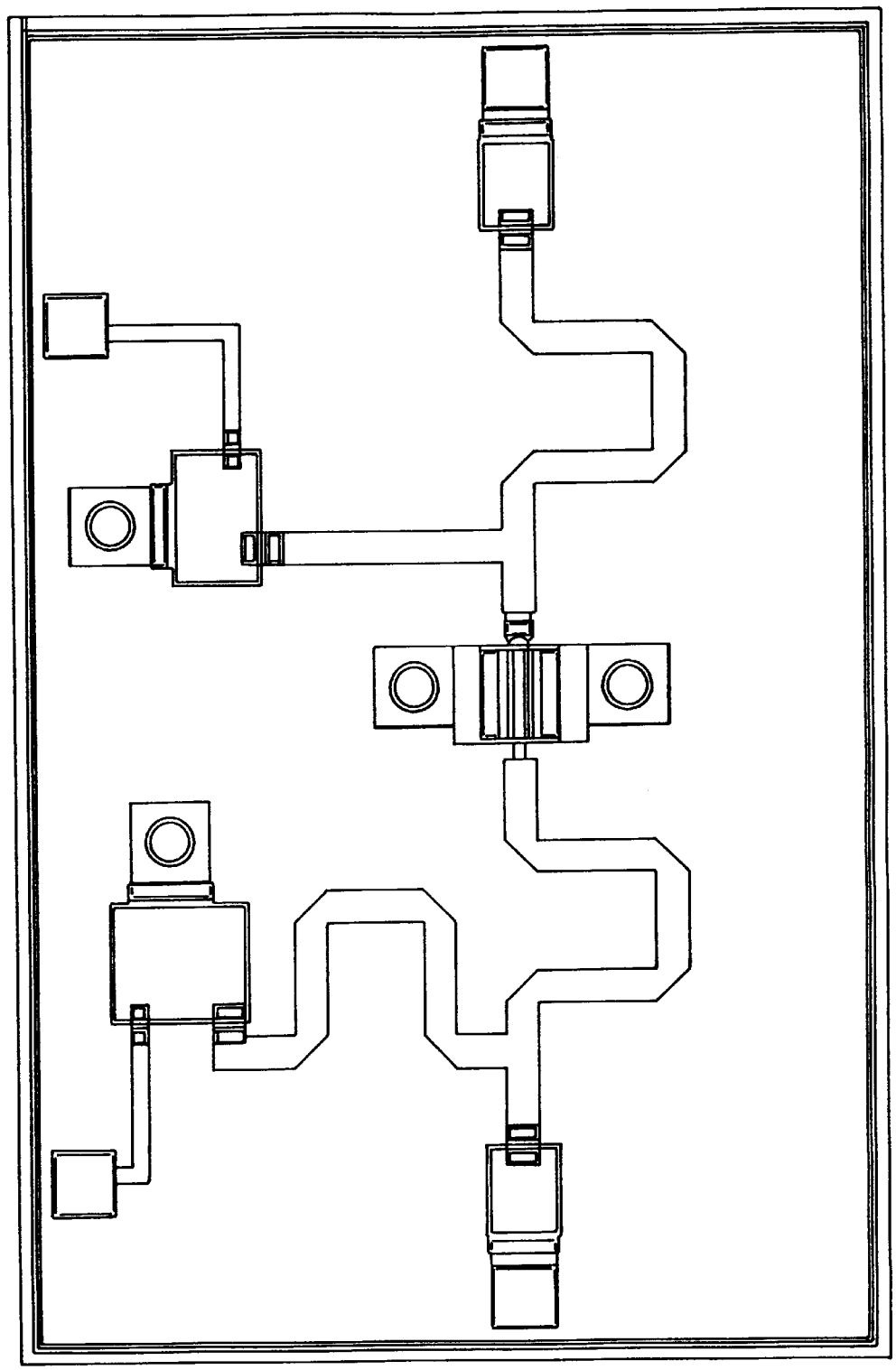
FIG. 7 is a diagram illustrating a mask pattern for producing an IC obtained by a logical operation on the drawing objects of layout data of the virtual IC of FIG. 6.

In addition, when the designer inputs the orders for producing a mask pattern from the input device 13, the mask pattern producing means 10c receives the order signals, reads the layout data for displaying the virtual IC of FIG. 6 from the data file storage device 40, reads processing data produced on the basis of the design rule in the actual production process, i.e., a production apparatus and production environments from the disk device 12, performs logical operations between the drawing objects of the layout data on the basis of the processing data, and generates a mask pattern for IC production shown in FIG. 7 on the CRT display 16 (steps S10 and S11).

Here, a production process of the microwave IC shown in FIG. 3 comprises ion implantation of an FET part, forming FET part ohmic electrodes, forming an FET part gate metal, forming MIM capacitor lower electrodes, forming first contact holes, forming MIM capacitor upper electrodes and wiring metals, forming second contact holes, forming airbridge metals, and forming via-holes. The above-described logical operation between the drawing objects is performed corresponding to these respective steps, by oversizing of the drawing objects, logical AND/OR operation between the drawing objects, and the like. FIGS. 9 to 17 show mask patterns formed by logical operation in the respective steps, and FIG. 7 shows a mask pattern including all these mask patterns displayed on the CRT display.

A detailed description will be given of the logical operation, taking connecting parts between the MIM capacitor and the microstrip line as an example.

Figure 8:
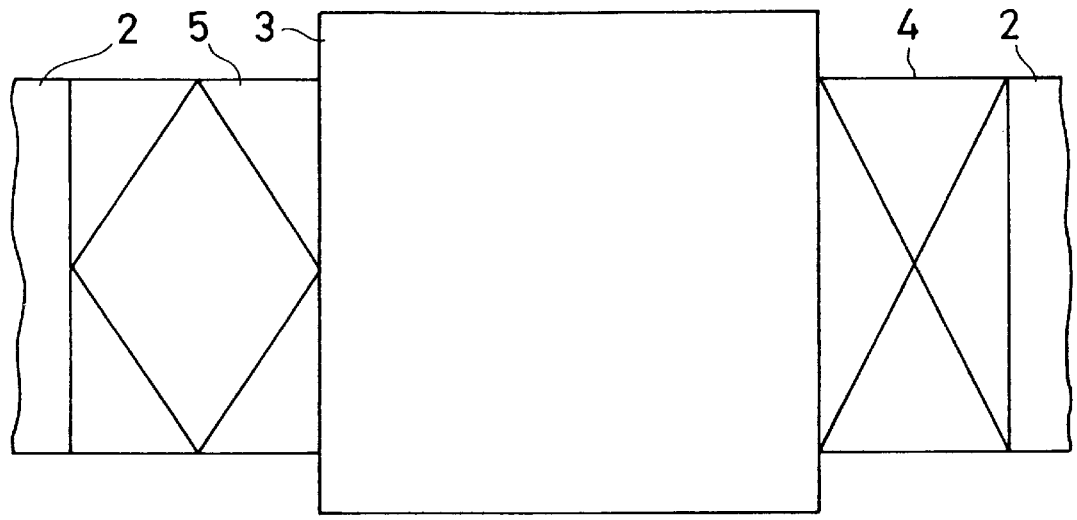
FIGS. 8(a) and 8(b) are enlarged views showing a connecting part between an MIM capacitor and a microstrip line in the virtual IC of FIG. 6 and the mask pattern of FIG. 7.
Figure 8:
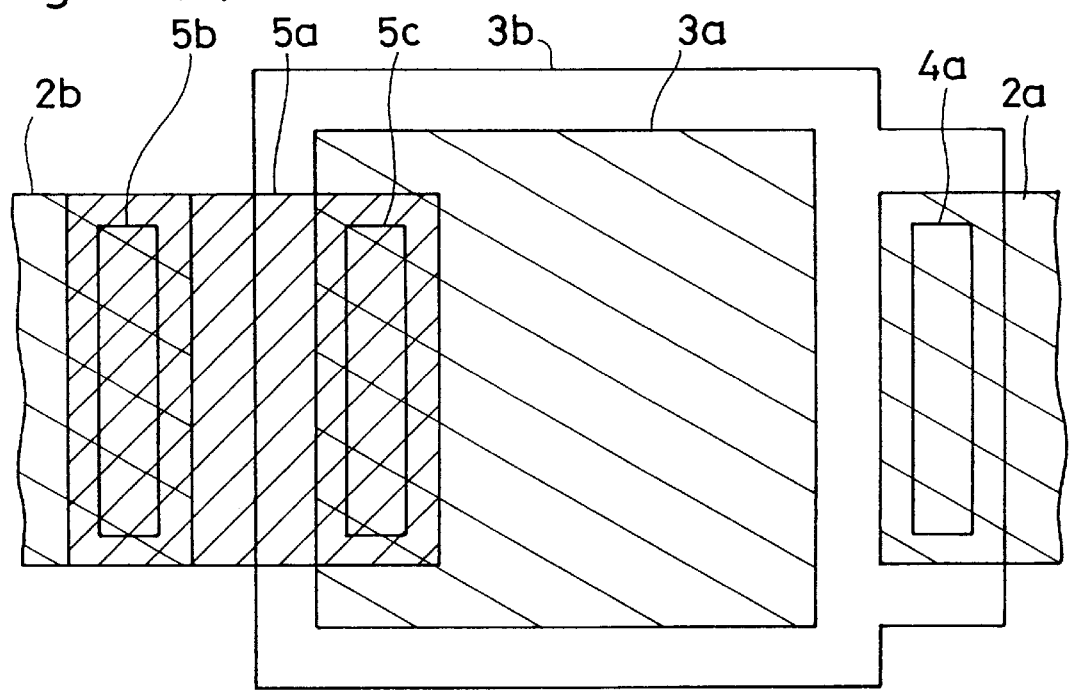
Figure 9:
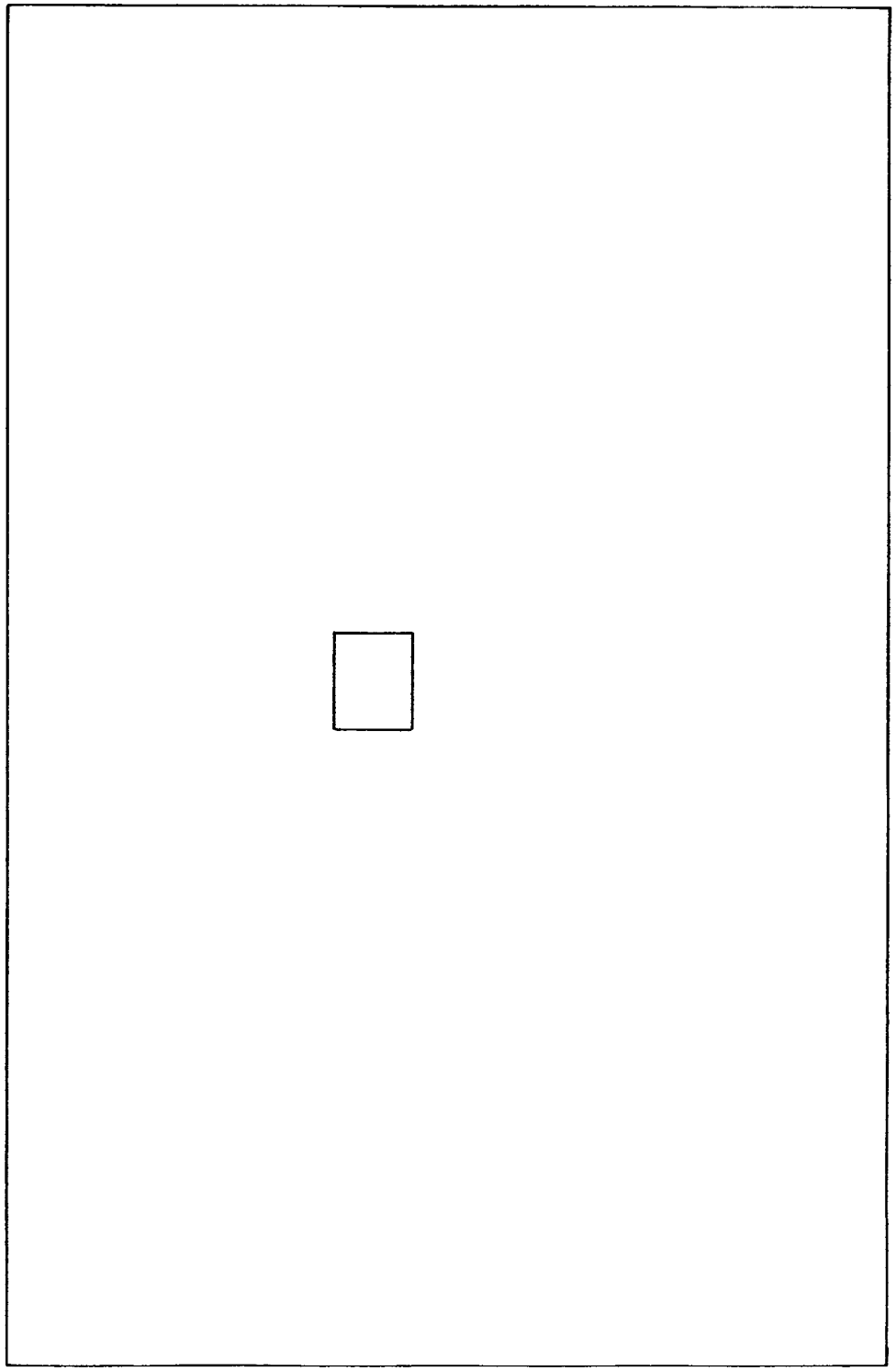
FIG. 9 is a diagram illustrating a mask pattern for ion implantation.
Figure 10:
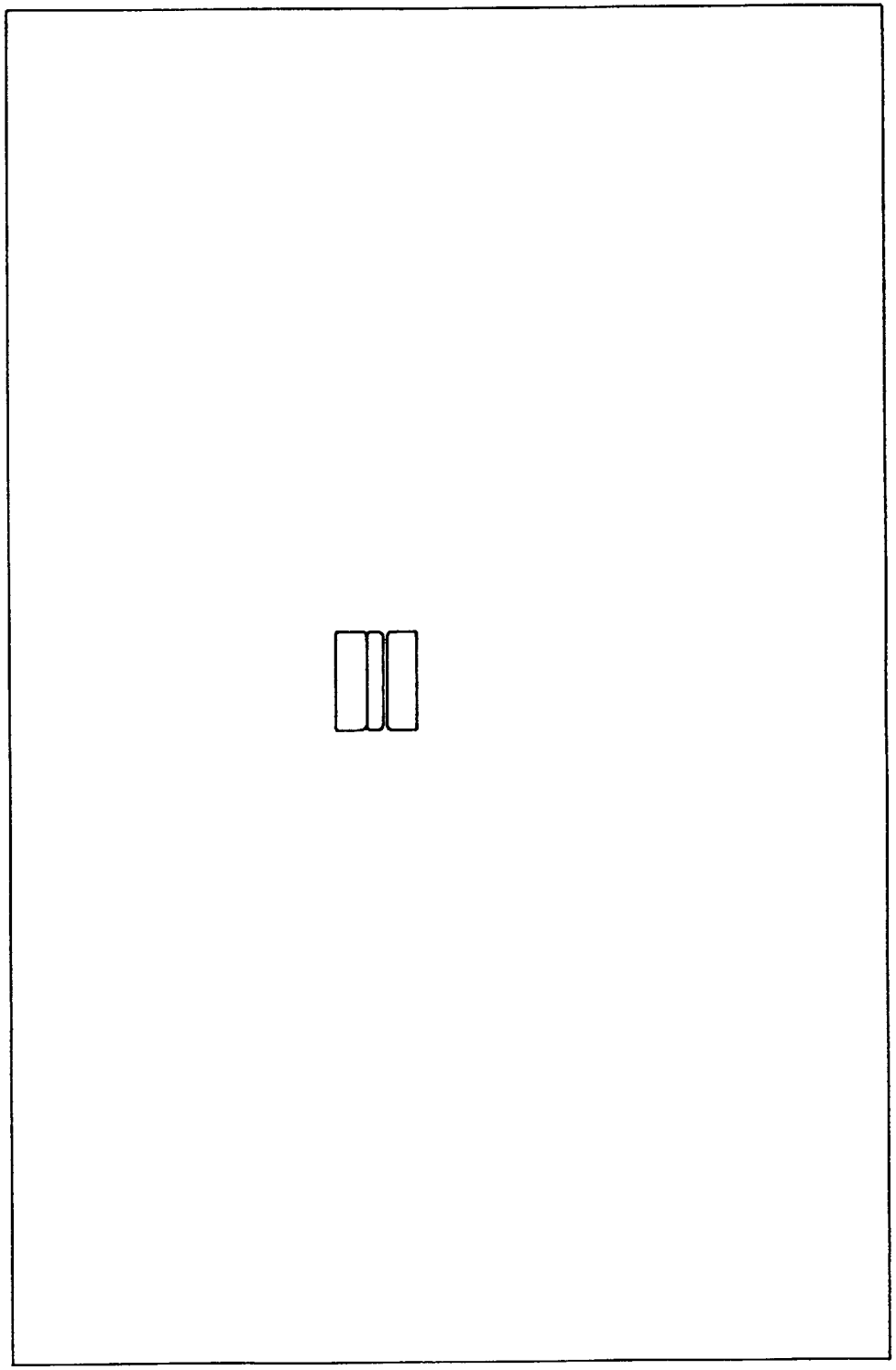
FIG. 10 is a diagram illustrating a mask pattern for a step of forming FET ohmic electrodes.
Figure 11:
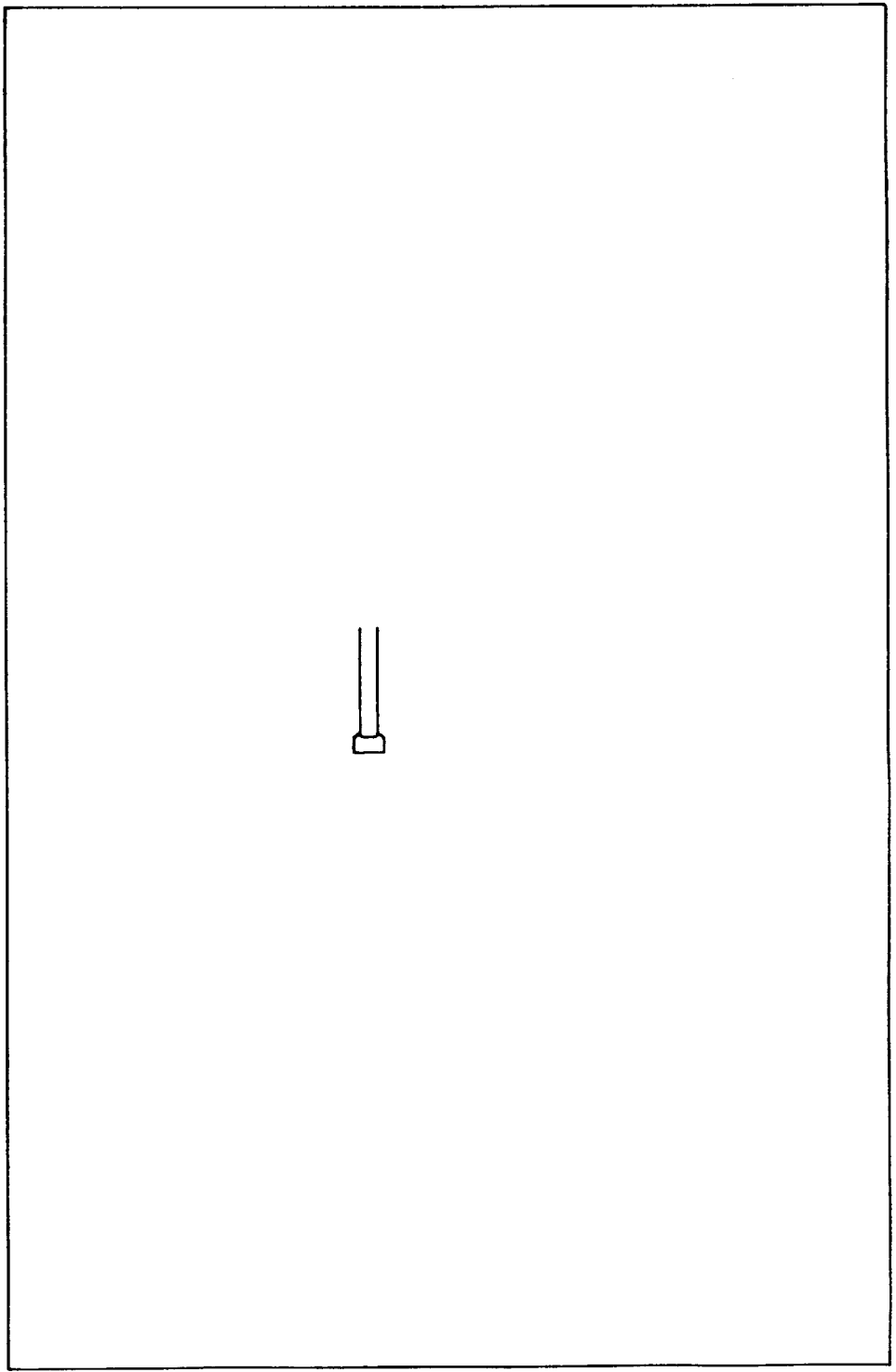
FIG. 11 is a diagram illustrating a mask pattern for a step of forming an FET gate electrode.
Figure 12:
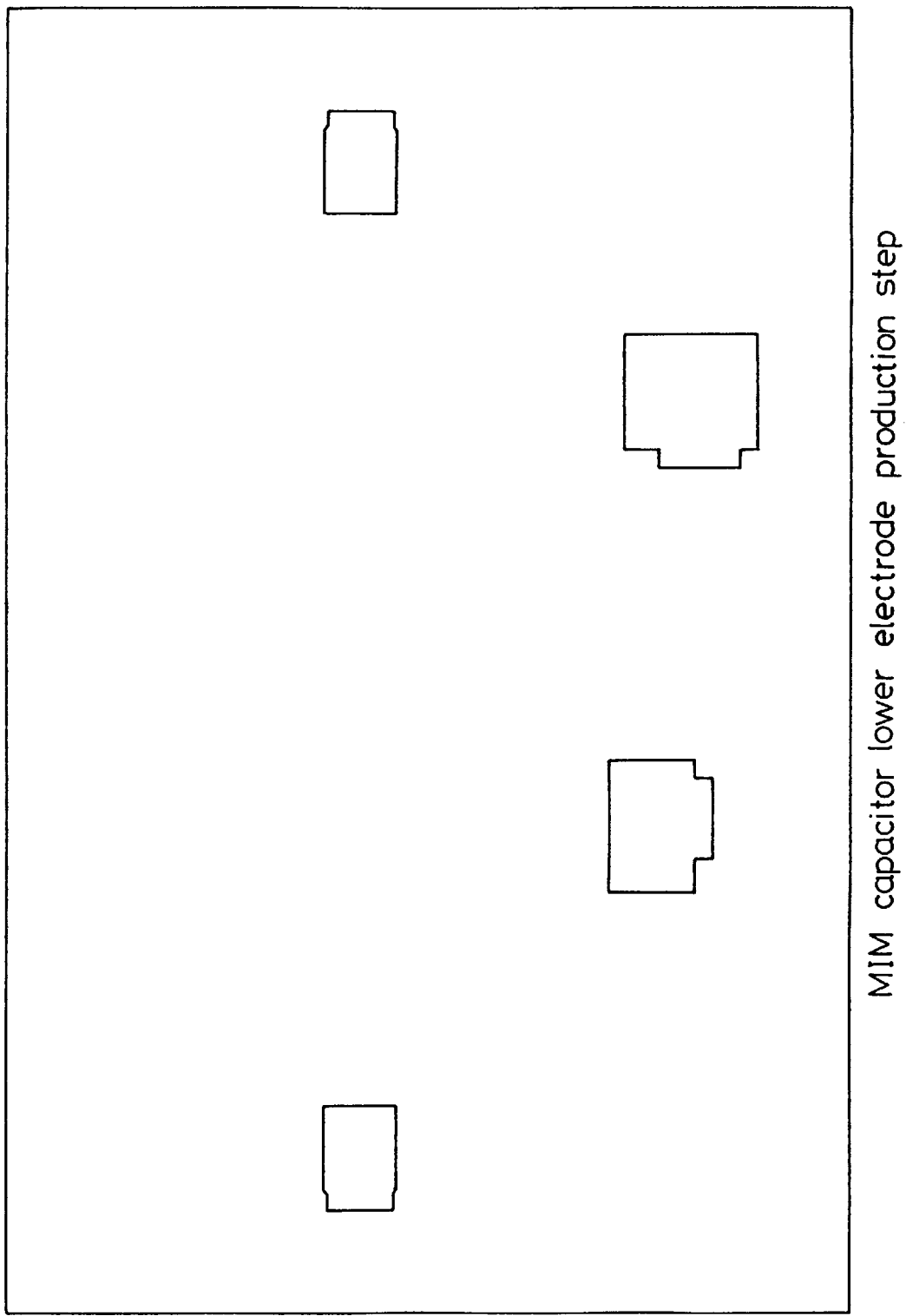
FIG. 12 is a diagram illustrating a mask pattern for a step of forming MIM capacitor lower electrodes.
Figure 13:
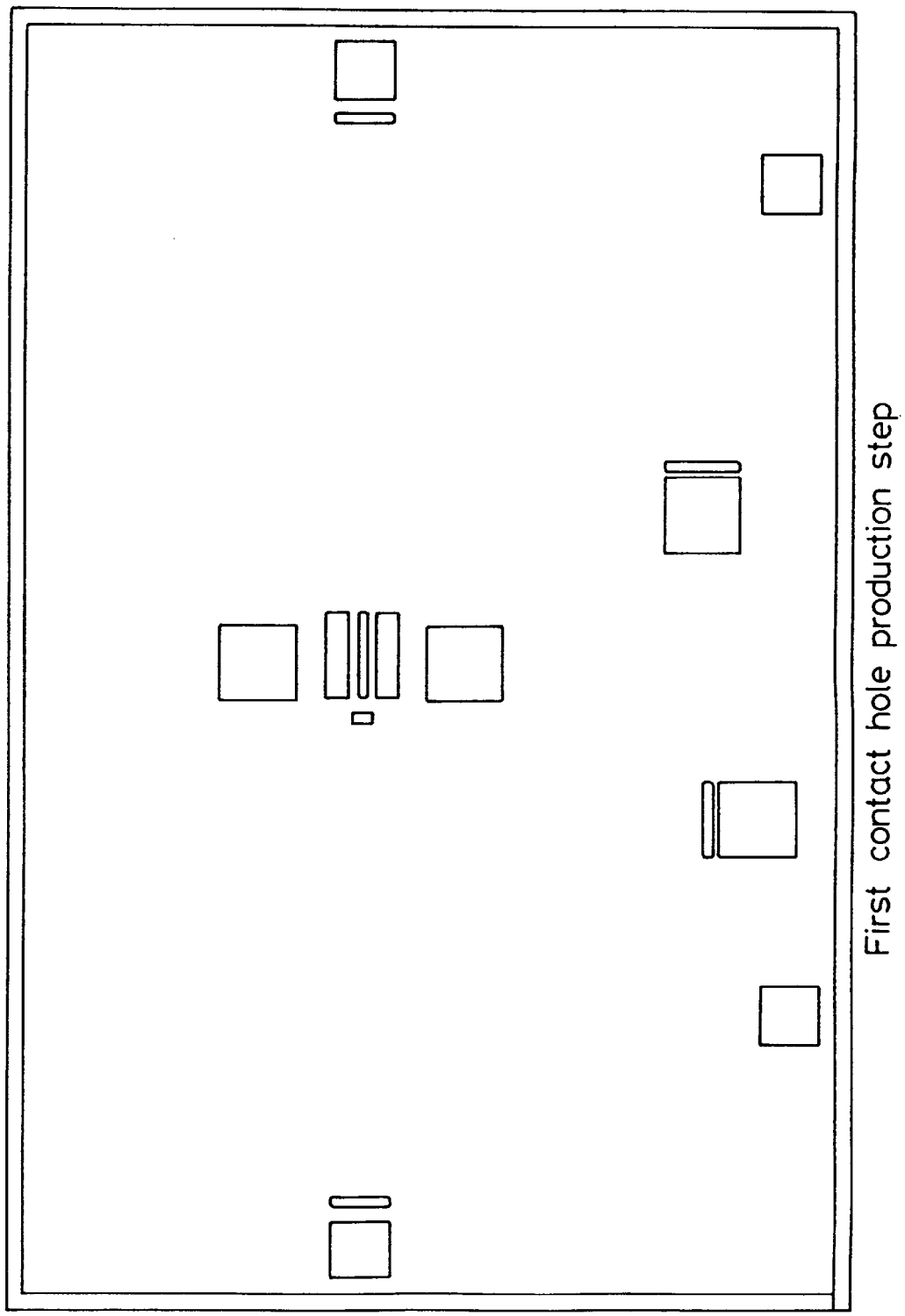
FIG. 13 is a diagram illustrating a mask pattern for a step of forming first contact holes.
Figure 14:
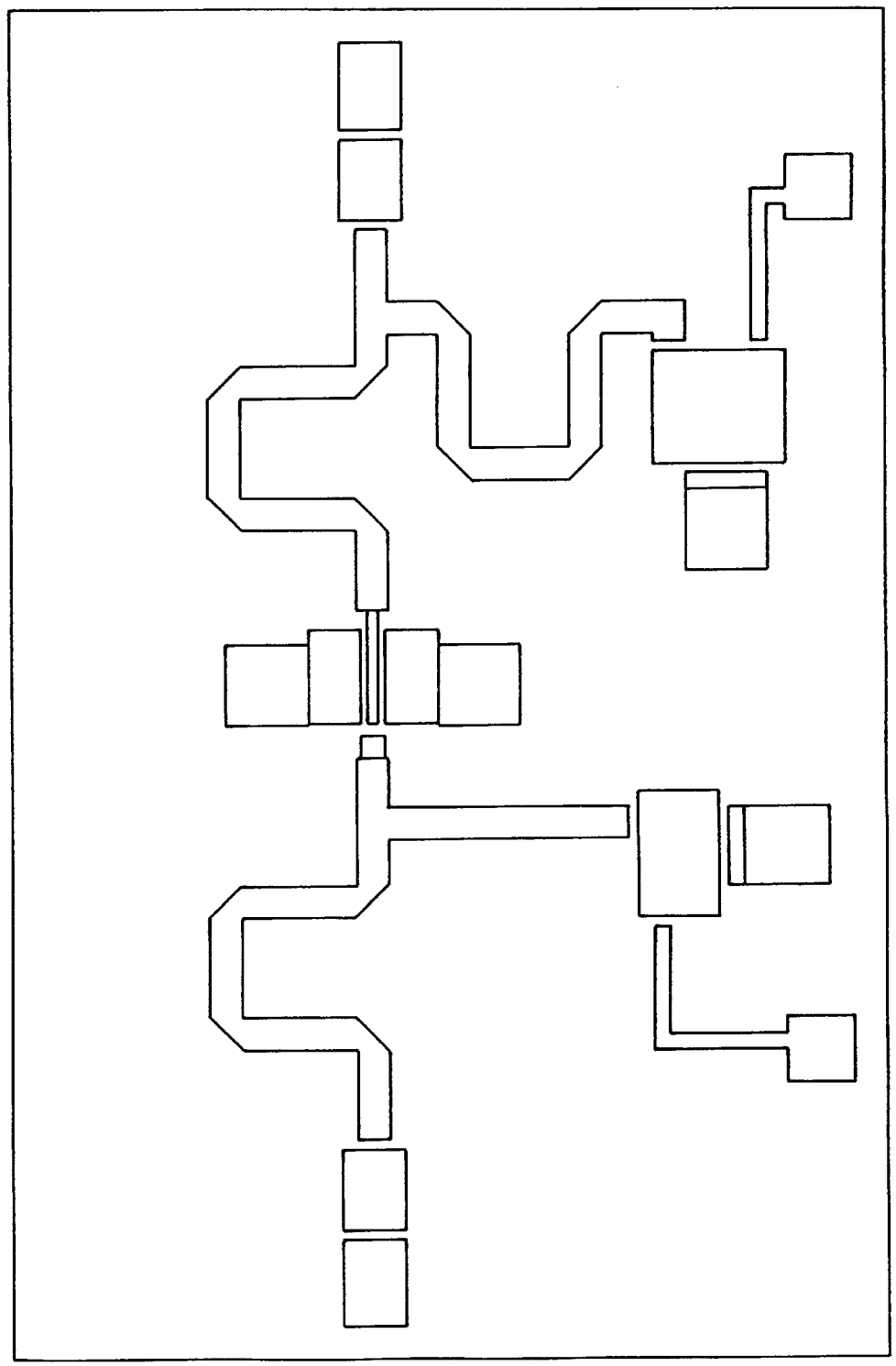
FIG. 14 is a diagram illustrating a mask pattern for a step of forming MIM capacitor upper electrodes and wiring metals.
Figure 15:
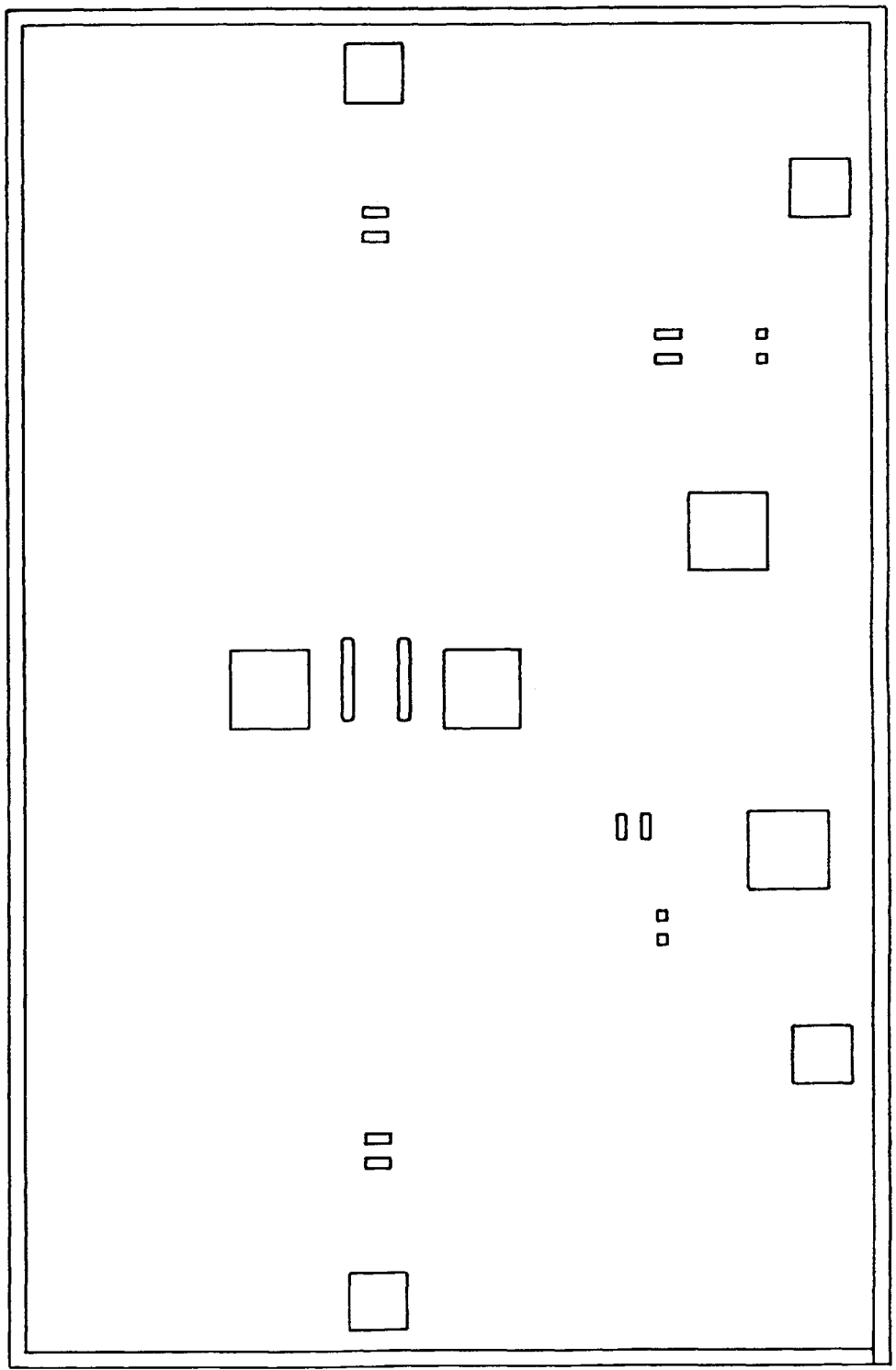
FIG. 15 is a diagram illustrating a mask pattern for a step of forming second contact holes for connecting an airbridge metal and the wiring metal.
Figure 16:
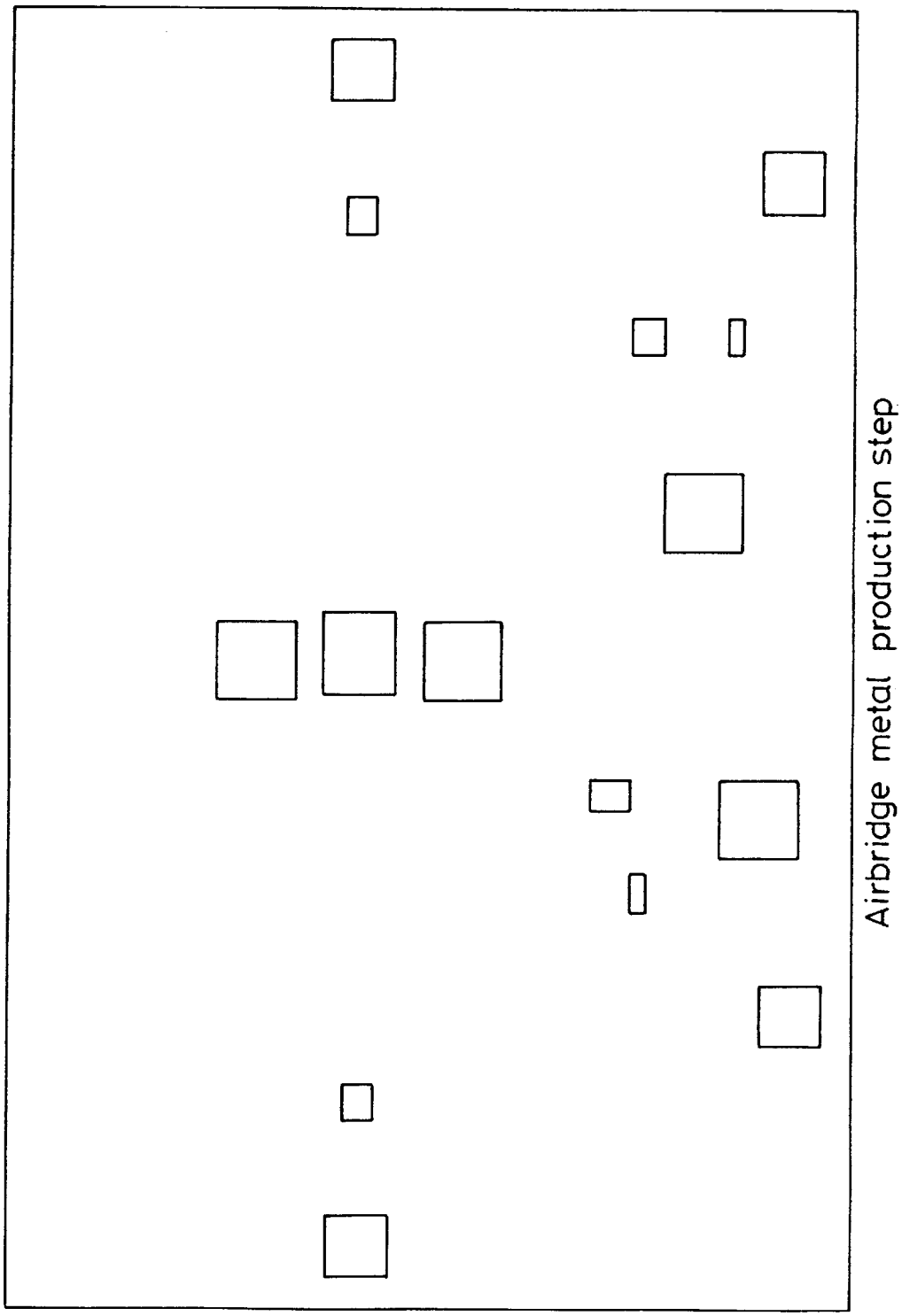
FIG. 16 is a diagram illustrating a mask pattern for a step of forming an airbridge.
Figure 17:
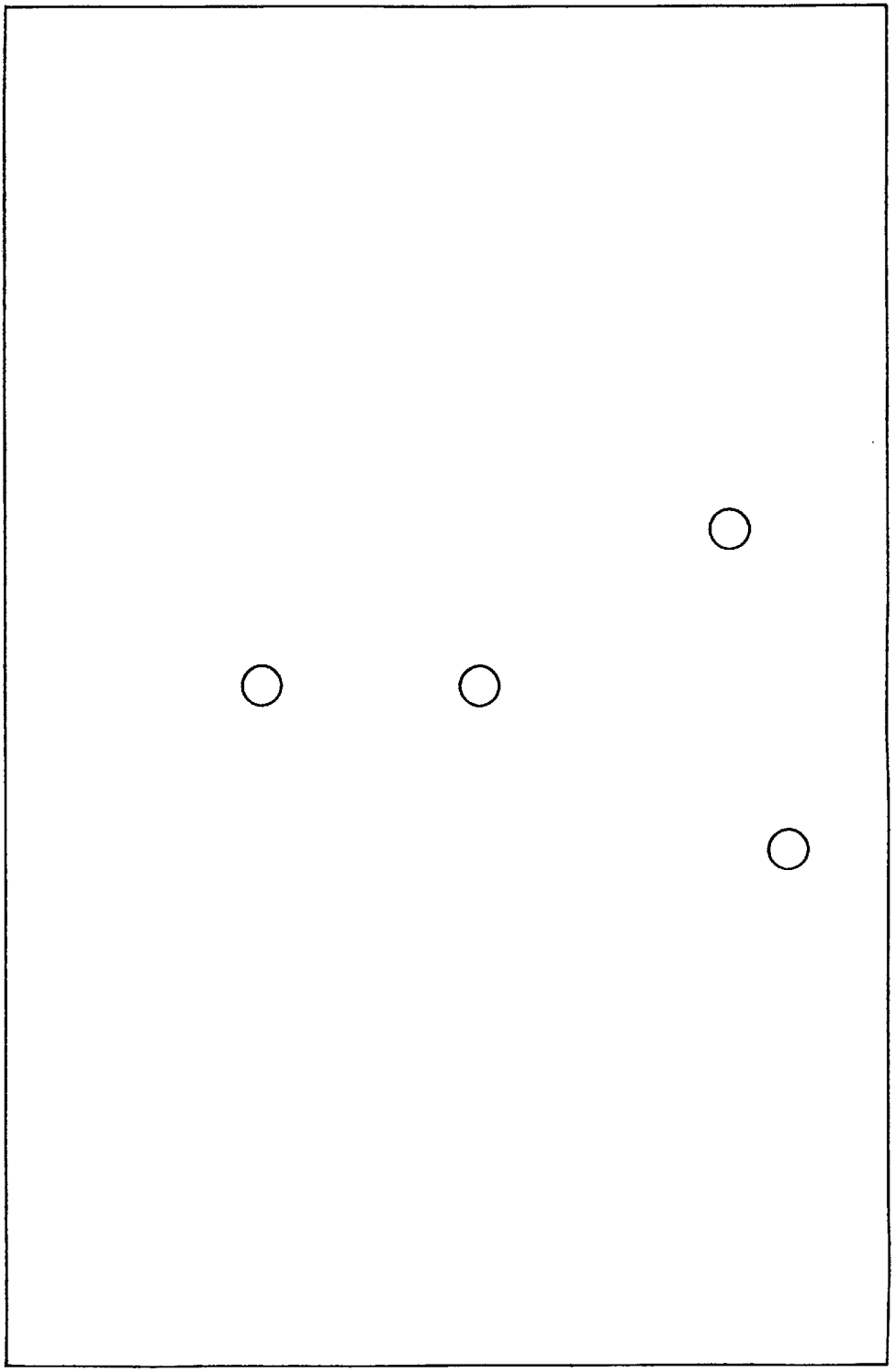
FIG. 17 is a diagram illustrating a mask pattern for a step of forming via-holes.
Figure 18:
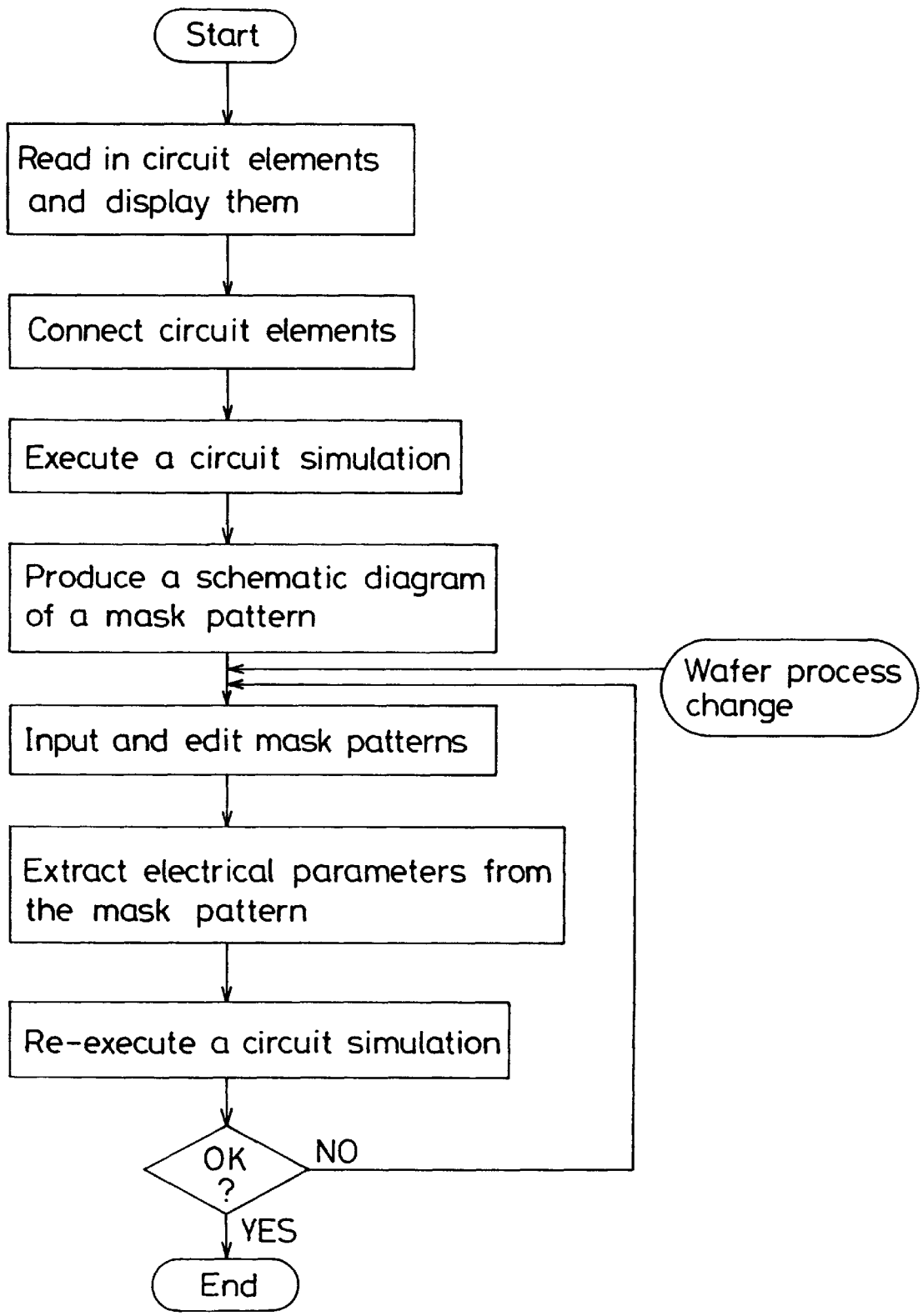
FIG. 18 is a flowchart showing a design process in a prior art method of layout design.
Figure 19:
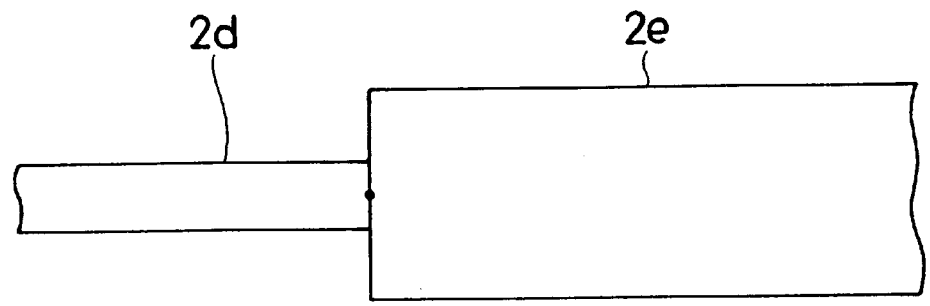
FIGS. 19(a) and 19(b) are diagrams respectively illustrating a connecting example of two mask patterns for microstrip line having different widths and a connecting example of two mask patterns for microstrip line extending in perpendicular directions to each other which are shown on a CRT display of the prior art device for layout design.
Figure 19:
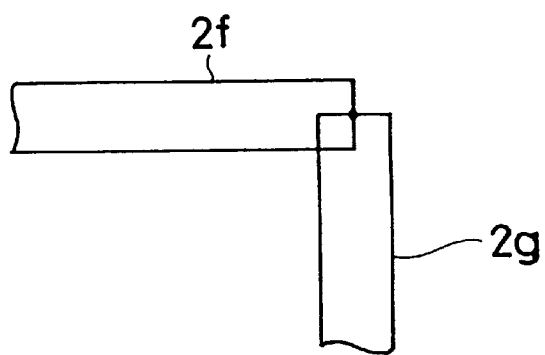

FIG. 8(a) shows the connecting parts between the MIM capacitor and the microstrip line of the layout data read from the data file storage device 40. FIG. 8(b) shows the connecting parts between the MIM capacitor and the microstrip line in a mask pattern for IC production obtained from the layout data. As shown in the figures, a mask pattern 3a of the MIM capacitor upper electrode is produced by copying the MIM capacitor 3 as it is. A mask pattern 3b of the MIM capacitor lower electrode is produced by a logical OR operation between the MIM capacitor 3 and the MIM capacitor lower electrode connecting part 4, and further by oversizing the result of this OR operation. Here, the amount of the oversizing is set by the above-described design rule. A mask pattern 2a of the wiring metal of a microstrip line on the side of the MIM capacitor lower electrode is produced by a logical AND operation between the result of the OR operation between the MIM capacitor lower electrode connecting part 4 and the microstrip line 2, and a complementary set of an oversizing of the MIM capacitor. A mask pattern 4a of a contact hole connecting the MIM capacitor lower electrode and the microstrip line is produced by an AND operation between the mask pattern 2a of the wiring metal and the mask pattern 3b of the MIM capacitor lower electrode, and further by undersizing of the result of this AND operation. Similarly, the following mask patterns are produced by logical operations between drawing objects: a mask pattern 2b of the microstrip line on the side of the MIM capacitor upper electrode, a mask pattern 5a of the airbridge metal connecting the MIM capacitor upper electrode to the microstrip line 2, a mask pattern 5b of a contact hole connecting the airbridge metal to the microstrip line 2, and a mask pattern 5c of a contact hole connecting the airbridge metal to the MIM capacitor upper electrode.

In such a method for designing a layout in accordance with the present invention, the circuit elements of the milliwave IC or the microwave IC are displayed on the CRT display 16 with rectangular drawing objects of which the area and dimensions represent electrical data, the virtual IC is produced by connecting the drawing objects on the CRT display 16, the layout of the virtual IC is optimized so that its electrical characteristics may be equal to those of an IC to be designed, and its area may be minimized, and a mask pattern for IC production is obtained from the layout data of the virtual IC. Therefore, the layout of the IC is designed only with the data required for electrical design, the memory capacity required for executing a circuit simulation is reduced relative to the conventional method, a device for designing layout is produced with low cost, and the processing speed of a circuit simulation is accelerated, reducing the time required for design work. Since the mask pattern for IC production is produced by logical operations between drawing objects of the layout data of the virtual IC, differently from the conventional method, it is not necessary to optimize the layout of the mask patterns every time the production process is changed, thereby simplifying the design work. When the drawing objects corresponding to the circuit elements are displayed on the CRT display, the rectangular drawing objects representing connecting margins between the elements in the actual production process are displayed on the sides of the respective drawing objects at the same time. Therefore, in changing the dimensions, the configuration and the arrangement of the drawing objects, the elements to be kept apart are not brought too close to each other, simplifying the design work and increasing design precision. In connecting the drawing objects representing the circuit elements on the CRT display, since overlapping the edges of the respective drawing objects is prescribed as a rule, the virtual IC is produced so that the wiring structure may be extremely close to that of the actual IC, increasing design precision. Since electro-magnetic coupling between the circuit elements of the virtual IC is calculated on the basis of electro-magnetic field analysis theory, and a circuit simulation is executed considering the electro-magnetic coupling between circuit elements, the layout of the virtual IC is optimized considering the changes in the electrical characteristics after connecting the circuit elements, further increasing design precision.

While in the above-described embodiment the drawing objects representing the connecting parts are added to the drawing objects corresponding to the circuit elements to be generated on the CRT display, when producing the drawing objects corresponding to the circuit elements, the connecting part can be represented as a segment of a part of the drawing object corresponding to the circuit element, and thereafter, the connecting part can be represented as a closed drawing object on the plane by logical operation using the drawing objects corresponding to the circuit elements on the CRT display. For example, the connecting part 4 of the MIM capacitor lower electrode illustrated in FIG. 8(*a*) is produced by a logical AND operation between the oversizing of the MIM capacitor 3 and the microstrip line 2.

While the mask pattern producing means 10*c* is disposed in the same central processing unit 10 as the other image display controlling means 10*a*, the circuit simulation executing means 10*d* and the layout data file producing means 10*b* in the above-described embodiment, the mask pattern producing means 10*c* is in a central processing unit of another CAD system, and the virtual IC and the mask pattern for IC production can be respectively produced in the different CAD systems.

What is claimed is:

1. A method of designing layout of milliwave and microwave integrated circuits comprising:

in response to external signals, selecting from a data storage unit in which respective lumped circuit elements, including active elements, and distributed constant transmission lines for constituting an integrated circuit (IC) are represented as corresponding closed simplified drawing objects in a two-dimensional plane, the simplified drawing objects being stored as drawing object data, areas and dimensions of the simplified drawing objects being defined to correspond to electrical data of the respective lumped circuit elements and distributed constant transmission lines, the dimensions being proportional to respective actual dimensions of the corresponding lumped circuit elements and distributed constant transmission lines, and displaying the selected simplified drawing objects on a screen of a display unit;

connecting the selected simplified drawing objects displayed on the screen of the display unit by overlapping their respective edges, based on a circuit diagram of the IC to be designed, to form an IC layout pattern corresponding to the circuit diagram;

calling up, in response to external signals, stored processing data, including a design rule defined in accordance with each process employed in producing the integrated circuit, and performing logical operations on the simplified drawing objects, using the processing data, to produce a mask pattern for manufacturing the integrated circuit.

2. The method of claim 1 comprising, between the connecting and the calling up, executing a circuit simulation of the IC layout pattern on the screen of the display unit, and changing the areas and the dimensions of the simplified drawing objects in response to the simulation so that the IC has desired electrical characteristics, thereby optimizing the IC layout pattern.

3. The method of claim 1 comprising, between the connecting and the calling up, changing arrangement of the simplified drawing objects representing the lumped circuit elements and configurations of the simplified drawing objects representing the distributed constant transmission lines, to reduce area of the IC layout pattern on the screen of the display unit while maintaining desired electrical characteristics of the IC layout pattern, thereby optimizing the IC layout pattern.

4. The method of claim 1 comprising, between the connecting and the calling up:

executing a circuit simulation of the IC layout pattern on the screen of the display unit, and changing the areas and the dimensions of the simplified drawing objects in response to the simulation so that the IC has desired electrical characteristics, thereby optimizing the IC layout pattern;

changing arrangement of the simplified drawing objects representing the lumped circuit elements and configurations of the simplified drawing objects representing the distributed constant transmission lines, to reduce area of the IC layout pattern on the screen of the display unit while maintaining desired electrical characteristics of the IC layout pattern, thereby optimizing the IC layout pattern.

5. The method of claim 1 wherein the simplified drawing objects representing the lumped circuit elements have, in part, connection segments corresponding to connection margins between circuit elements in a manufacturing process.

6. The method of claim 2 wherein the simplified drawing objects representing lumped circuit elements have, in part, connection segments corresponding to connection margins between circuit elements in a manufacturing process.

7. The method of claim 3 wherein the simplified drawing objects representing lumped circuit elements have, in part, connection segments corresponding to connection margins between circuit elements in a manufacturing process.

8. The method of claim 4 wherein the simplified drawing objects representing lumped circuit elements have, in part, connection segments corresponding to connection margins between circuit elements in a manufacturing process.

9. The method of claim 3 including calculating electromagnetic coupling of the simplified drawing objects and executing the circuit simulation of the IC layout pattern based on the calculation; and changing arrangement of the simplified drawing objects representing the lumped circuit elements and configurations of the simplified drawing objects representing the distributed constant transmission lines in response to the circuit simulation.

10. The method of claim 4 calculating electromagnetic coupling of the simplified drawing objects and executing the circuit simulation of the IC layout pattern based on the calculation; and changing arrangement of the simplified drawing objects representing the lumped circuit elements and configurations of the simplified drawing objects representing the distributed constant transmission lines in response to the circuit simulation.

11. A device for designing layout of milliwave and microwave integrated circuits comprising:

a data storage unit for showing respective lumped circuit elements and distributed constant transmission lines for constituting an integrated circuit (IC) as corresponding closed simplified drawing objects in a two-dimensional plane, and storing drawing object data in which areas and dimensions of the simplified drawing objects are defined to correspond to electrical data of the respective lumped circuit elements and distributed constant transmission lines and the dimensions are proportional to respective actual dimensions of the corresponding lumped circuit elements and distributed constant transmission lines;

a screen display control unit for selecting, in response to external signals, the drawing object data of the simplified drawing objects of the lumped circuit elements and the distributed constant transmission lines for constituting the IC to be designed from the data storage unit, and connecting, in response to the external signals, the selected simplified drawing objects by overlapping their respective edges based on the selected drawing object data, and changing the areas, the dimensions and the configurations of the selected simplified drawing objects in response to the external signals;

an image display unit for displaying images of the simplified drawing objects and an IC layout pattern comprised of simplified drawing objects, in accordance with signals from the screen display control unit; and a mask pattern producing unit for, based on the drawing object data of the IC layout pattern displayed on the image display unit, calling up, in response to the external signals, stored processing data including a design rule defined in accordance with each process of producing the IC, and performing logical operations on the simplified drawing objects, using the processing data, to produce a mask pattern for manufacturing the IC.

* * * * *